US009972681B2

(12) United States Patent
Ankoudinov et al.

(10) Patent No.: US 9,972,681 B2
(45) Date of Patent: May 15, 2018

(54) HIGH VOLTAGE VERTICAL SEMICONDUCTOR DEVICE WITH MULTIPLE PILLARS IN A RACETRACK ARRANGEMENT

(71) Applicant: Power Integrations, Inc., San Jose, CA (US)

(72) Inventors: Alexei Ankoudinov, San Jose, CA (US); Sorin Georgescu, San Jose, CA (US); Vijay Parthasarathy, Sunnyvale, CA (US); Kelly Marcum, Cedar Hills, UT (US); Jiankang Bu, Temecula, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days. days.

(21) Appl. No.: 15/617,992

(22) Filed: Jun. 8, 2017

(65) Prior Publication Data

US 2018/0061947 A1    Mar. 1, 2018

Related U.S. Application Data

(60) Provisional application No. 62/381,447, filed on Aug. 30, 2016.

(51) Int. Cl.
*H01L 29/06* (2006.01)
*H01L 29/78* (2006.01)
(Continued)

(52) U.S. Cl.
CPC ...... *H01L 29/0692* (2013.01); *H01L 29/0649* (2013.01); *H01L 29/0865* (2013.01);
(Continued)

(58) Field of Classification Search
CPC ............ H01L 29/0692; H01L 29/0696; H01L 29/1083; H01L 29/4238
See application file for complete search history.

(56) References Cited

U.S. PATENT DOCUMENTS

| 6,492,691 | B2 * | 12/2002 | Magri' ................ H01L 29/0696 257/339 |
| 7,595,523 | B2 | 9/2009 | Parthasarathy et al. |

(Continued)

FOREIGN PATENT DOCUMENTS

| JP | 2005-286042 | 10/2005 |
| JP | 2011-134951 | 7/2011 |

OTHER PUBLICATIONS

European Pat. Application No. 17187811.9-1212—Extended European Search Report dated Jan. 22, 2018, 10 pages.

*Primary Examiner* — Eric Ward
(74) *Attorney, Agent, or Firm* — Christensen O'Connor Johnson Kindness PLLC

(57) ABSTRACT

A semiconductor device including a dummy pillar and a plurality of racetrack pillars. The dummy pillar of semiconductor material extends in a first lateral direction. The plurality of racetrack pillars, including the semiconducting material, surrounds the dummy pillar. Each of the plurality of racetrack pillars has a first linear section, which extends in the first lateral direction, and a first rounded section to form a racetrack shape. The plurality of racetrack pillars includes a first racetrack pillar and a second racetrack pillar. The first racetrack pillar is disposed proximate to the dummy pillar and the second racetrack pillar surrounds the first racetrack pillar. The first racetrack pillar is disposed between the dummy pillar and the second racetrack pillar. The semiconductor device includes a plurality of spacing regions (Continued)

including a first spacing region that surrounds the dummy pillar and is disposed between the first racetrack pillar and the dummy pillar.

21 Claims, 6 Drawing Sheets

(51) Int. Cl.

| | |
|---|---|
| *H01L 29/08* | (2006.01) |
| *H01L 29/10* | (2006.01) |
| *H01L 29/40* | (2006.01) |
| *H01L 29/861* | (2006.01) |
| *H01L 29/739* | (2006.01) |
| *H01L 27/08* | (2006.01) |
| *H01L 27/088* | (2006.01) |

(52) U.S. Cl.
CPC ...... *H01L 29/0882* (2013.01); *H01L 29/1095* (2013.01); *H01L 29/404* (2013.01); *H01L 29/407* (2013.01); *H01L 29/7811* (2013.01); *H01L 29/7827* (2013.01); *H01L 27/088* (2013.01); *H01L 27/0814* (2013.01); *H01L 29/7395* (2013.01); *H01L 29/861* (2013.01)

(56) References Cited

U.S. PATENT DOCUMENTS

| | | | | |
|---|---|---|---|---|
| 7,859,037 | B2* | 12/2010 | Parthasarathy | H01L 27/0207 257/302 |
| 7,964,912 | B2* | 6/2011 | Parthasarathy | H01L 29/0657 257/328 |
| 8,653,600 | B2* | 2/2014 | Parthasarathy | H01L 29/0692 257/367 |
| 9,691,844 | B2* | 6/2017 | Kim | H01L 29/0619 |
| 2005/0242392 | A1 | 11/2005 | Pattanayak et al. | |
| 2009/0189181 | A1 | 7/2009 | Koyama et al. | |
| 2014/0327070 | A1* | 11/2014 | Hirler | H01L 29/063 257/329 |

* cited by examiner

HIGH VOLTAGE VERTICAL SEMICONDUCTOR DEVICE WITH MULTIPLE PILLARS IN A RACETRACK ARRANGEMENT

CROSS-REFERENCE TO RELATED APPLICATION

This application claims the benefit of U.S. Provisional Application No. 62/381,447, filed on Aug. 30, 2016.

FIELD OF THE DISCLOSURE

The present invention relates generally to semiconductor devices and in particular, but not exclusively, relates to vertical semiconductor devices.

BACKGROUND INFORMATION

High-voltage applications such as motor drives, uninterruptible power supplies, and solar inverters may use power semiconductor devices. A variety of power semiconductor devices are available depending on the specific requirements of the application, such as power diodes, power metal-oxide-semiconductor field-effect transistors (MOSFET), bipolar-junction transistors (BJT), insulated gate bipolar transistors (IGBT), thyristors, etc.

Performance metrics of power semiconductor devices may include operating current and voltage, input and output impedance, switching speed, reverse-bias breakdown voltage, etc. The type of power semiconductor device utilized may be based in part on these performance metrics. Additional factors such as cost and device area may also contribute to the determination of the type of power semiconductor device utilized.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
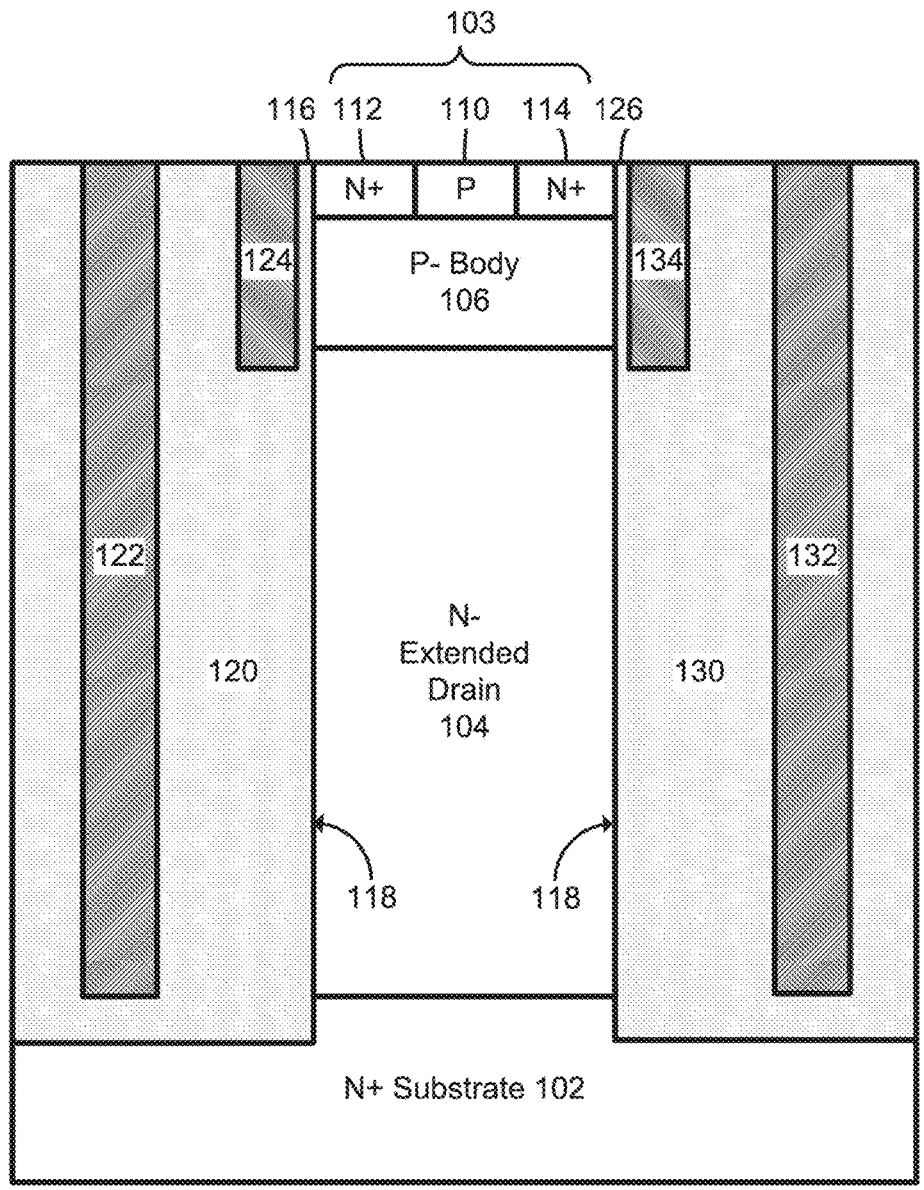
FIG. 1 is a cross sectional illustration of an example vertical high-voltage field-effect transistor (HVFET), in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exagerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 is a cross sectional illustration of an example vertical high-voltage field-effect transistor (HVFET) 100, in accordance with the teachings of the present invention. HVFET 100 includes substrate 102, racetrack pillar 103 (including semiconductor material), insulating material 120, insulating material 130, field plate 122, field plate 132, gate electrode 124, gate electrode 134, gate oxide 116, and gate oxide 126. Racetrack pillar 103 includes source region 112, source region 114, middle region 110, body region 106, and drain region 104.

HVFET 100 employs a vertical device structure that supports or blocks an applied high-voltage (e.g., several hundred volts) when the device is in the "off" state. Racetrack pillar 103 may be a mesa or pillar of the semiconductor material disposed on or in substrate 102. Racetrack pillar 103 may include source region 112 of a first conductivity type, source region 114 of the first conductivity type, middle region 110 of a second conductivity type, body region 106 of the second conductivity type, and drain region 104 of the first conductivity type.

In one example, drain region 104 is an extended drain of N-type doped silicon formed on an N+ doped silicon substrate 102. Substrate 102 may be heavily doped to minimize resistance to current flowing through the drain electrode (in this example, N− extended drain region 104), which is located proximate to the bottom of substrate 102 in the completed semiconductor device 100. Body region 106 and middle region 110 are P doped silicon. Source region 112 and source region 114 are N+ doped silicon. Source region 112 and source region 114 are laterally separated from each other by middle region 110. Source region 112, source region 114, and middle region 110 are formed near the top surface of racetrack pillar 103. As illustrated, body region 106 is disposed between, and vertically separates, drain region 104 from source region 112, source region 114, and middle region 110.

In another example, racetrack pillar 103 may be an epitaxial layer that extends from substrate 102 to a top surface of a silicon wafer. The doping concentration of the portion of racetrack pillar 103 (which includes drain region 104), may be linear graded to produce an extended drain region that exhibits a substantially uniform electric-field distribution. Linear grading may stop at some point below the top surface of drain region 104, or in other examples, racetrack pillar 103.

In one example, drain region 104, body region 106, source region 112, source region 114, and middle region 110 collectively form a cross-section of racetrack pillar 103 and form a pillar or mesa (both terms are used synonymously in the present disclosure) of silicon material. Vertical trenches may be formed on opposite sides 118 of racetrack pillar 103. The vertical trenches may be filled with a dielectric material (e.g., oxide) that makes up insulating material 120 and insulating material 130. The height and width of racetrack pillar 103, as well as the spacing between adjacent vertical trenches, may be determined by the breakdown voltage requirements of semiconductor device 100. In various examples, racetrack pillar 103 has a vertical height (thickness) in a range of about 30 micrometers to 120 micrometers. In another example, a HVFET formed on a die approximately 1 micrometer by 1 micrometer may have a racetrack pillar 103 with a vertical thickness of about 60 micrometers. By way of further example, a HVFET structure formed on a die having 2-4 millimeters on each side may have a racetrack pillar structure of approximately 30 micrometers thick. In certain examples, the lateral width of racetrack pillar 103 is as narrow as can be reliably manufactured (e.g., about 0.4 micrometers to 0.8 micrometers wide) in order to achieve a very high breakdown voltage (e.g., 600-800 V).

In another example, instead of arranging middle region 110 between source region 112 and source region 114 across the lateral width of racetrack pillar 103 (as illustrated in FIG. 1), source region 112 or body region may be alternately formed at the top of racetrack pillar 103 across the lateral length of racetrack pillar 103. In other words, a given cross-sectional view, such as that shown in FIG. 1, would have either source region 112 with N-doping, or body region 106 with P-doping, that extends across the full lateral width of racetrack pillar 103, depending upon where the cross-section is taken. In such an example, each source region 112 is adjoined on both sides (along the lateral length of racetrack pillar 103) by body region 106. Similarly, each body region 106 is adjoined on both sides (along the lateral length of racetrack pillar 103) by source region 112.

Insulating material 120 and insulating material 130 may comprise silicon dioxide, silicon nitride, or other suitable dielectric materials. Insulating material 120 and insulating material 130 may be formed using a variety of well-known methods, including thermal growth and chemical vapor deposition. Field plate 122 and field plate 132 are disposed within insulating material 120 and insulating material 130, respectively. Subsequently, field plate 122 and field plate 132 are fully insulated from substrate 102 and racetrack pillar 103. Field plate 122 and field plate 132 may be formed from a conductive material comprising a heavily doped polysilicon, a metal (or metal alloys), a silicide, or other suitable materials. In the completed semiconductor device 100 structure, field plate 122 and field plate 132 normally function as capacitive plates that may be used to deplete drain region 104 of charge when HVFET 100 is in the off state (i.e., when drain region 104 is raised to a high voltage). In one embodiment, the lateral thickness of insulating material 120 and insulating material 130 that respectively separate field plate 122 and field plate 132 from sidewall 118 of racetrack pillar 103 is approximately 4 micrometers.

The trench gate structure of HVFET 100 includes gate electrode 124 and gate electrode 134, each respectively disposed in insulating material 120 and insulating material 130 on opposite sides of racetrack pillar 103 between field plate 122 and field plate 132. Gate oxide 116 and gate oxide 126 may each respectively separate gate electrode 124 and gate electrode 134 from sidewalls 118 of racetrack pillar 103 adjacent to body region 106. Gate oxide 116 and gate oxide 126 may comprise a high-quality, thin (e.g., approximately 500 angstroms thick) dielectric material. Gate electrode 124 and gate electrode 134 may comprise polysilicon, or some other suitable material. In one example, gate electrode 124 and gate electrode 134 have a lateral width of approximately 1.5 micrometers and a depth of about 3.5 micrometers.

In one example, application of an appropriate voltage to gate electrode 124 and/or gate electrode 134 causes a conductive channel to form along the vertical sidewall portion 118 of body region 106 such that current may flow vertically through the semiconductor material, i.e., between a top surface of body region 106 (proximate to source region 112 and source region 114) and a bottom surface of body region 106 (proximate to drain region 104).

Figure 2A:
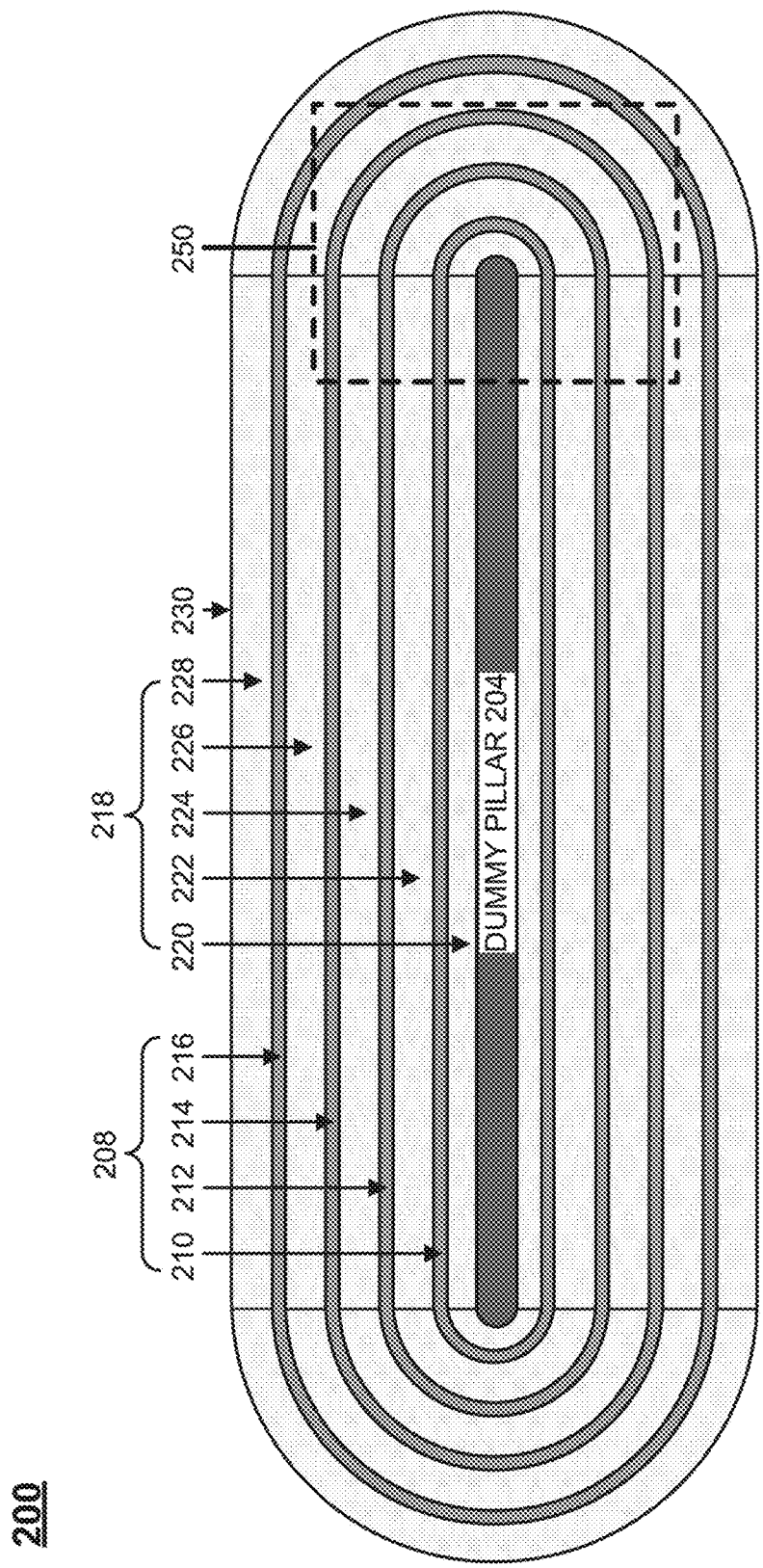
FIG. 2A illustrates an overhead view of an example semiconductor device, in accordance with the teachings of the present invention.

FIG. 2A illustrates an overhead view of one example semiconductor device 200 in accordance with the teachings of the present invention. Semiconductor device 200 includes dummy pillar 204, a plurality of racetrack pillars 208 (including first racetrack pillar 210, second racetrack pillar 212, third racetrack pillar 214, and fourth racetrack pillar 216), a plurality of spacing regions 218, (including first spacing region 220, second spacing region 222, third spacing region 224, fourth spacing region 226, and fifth spacing region 228), and boundary edge 230.

As illustrated, dummy pillar 204 (including the semiconductor material) extends in a first lateral direction. Plurality of racetrack pillars 208 (including the semiconductor material) surrounds dummy pillar 204. First racetrack pillar 210 is disposed proximate to dummy pillar 204 and is arranged between dummy pillar 204 and second racetrack pillar 212; second racetrack pillar 212 surrounds first racetrack pillar 210 and dummy pillar 204; third racetrack pillar 214 surrounds second racetrack pillar 212, first racetrack pillar 210, and dummy pillar 204, etc. Second racetrack pillar 212 is disposed between first racetrack pillar 210 and third racetrack pillar 214. Third racetrack pillar 214 is disposed between second racetrack pillar 212 and fourth racetrack pillar 216. While only four racetrack pillars (210, 212, 214, and 216) are illustrated in semiconductor device 200, it is appreciated that any number of racetrack pillars may be included. Individual racetrack pillars (210, 212, 214, and 216) in the plurality of racetrack pillars 208 and dummy pillar 204 are separated from each other by spacing regions included in plurality of spacing regions 218. First spacing region 220 surrounds dummy pillar 204 and is disposed between first racetrack pillar 210 and dummy pillar 204; second spacing region 222 surrounds first racetrack pillar 210 and is disposed between first racetrack pillar 210 and second racetrack pillar 212; third spacing region 224 surrounds second racetrack pillar 212 and is disposed between second racetrack pillar 212 and third racetrack pillar 214; fourth spacing region 226 surrounds third racetrack pillar 214 and is disposed between third racetrack pillar 214 and fourth racetrack pillar 216, etc. Semiconductor device 200 may have a boundary edge 230 to form a perimeter of semiconductor device 200.

In one example, a first distance between dummy pillar 204 and first racetrack pillar 210 is constant such that the first distance is equal to a first width of first spacing region 220. A second distance between first racetrack pillar 210 and second racetrack pillar 212 may also be constant such that the second distance is equal to a second width of second spacing region 222. The first width of first spacing region 220 may be different than second width of second spacing region 222. However, in other examples, the first width and the second width may be the same.

In another example, first spacing region 220, second spacing region 222, and third spacing region 224 include dielectric material. First spacing region 220 and second spacing region 222 are disposed to electrically isolate first racetrack pillar 210. Second spacing region 222 and third spacing region 224 are disposed to electrically isolate second racetrack pillar 212. For the sake of brevity only first spacing region 220, second spacing region 222, and third spacing region 224 are discussed. However, it is appreciated that each of the plurality of spacing regions 218 may include dielectric material. It is further appreciated that any two adjacent spacing regions may include dielectric material such that the two adjacent spacing regions electrically isolate a racetrack pillar disposed between them.

In one example, semiconductor device 200 is a high-voltage vertical transistor similar to the HVFET 100 illustrated in FIG. 1. For purposes of clarity, the individual components disposed within plurality of racetrack pillars 208 and plurality of spacing regions 218 are not illustrated in FIG. 2A. In some examples, each of the plurality of racetrack pillars 208 may include a source region of a first conductivity type, a body region of a second conductivity type, a drain region of the first conductivity type, a middle region of the second conductivity type, and a drain region of the first conductivity type. Additionally, a plurality of field plates, gate electrodes, and gate oxides may be surrounded by dielectric material and disposed in each of the plurality of spacing regions 218, in accordance with the teachings of the present invention.

In one example, HVFET 100 illustrated in FIG. 1 may represent as a cross-sectional view of second racetrack pillar 212, second spacing region 222, and third spacing region 224. A top surface of second racetrack pillar 212 may include middle region 110 disposed between source region 112 and source region 114. Second racetrack pillar 212 may also include body region 106 disposed between source region 112/114 and drain region 104. Middle region 110, source region 112, and source region 114 may be disposed proximate to a first surface of second racetrack pillar 212. In one example, the first surface of second racetrack pillar 212 is a top surface opposite of substrate 102. Insulating material 120 may correspond to dielectric material disposed within second spacing region 222. Similarly, insulating material 130 may correspond to dielectric material disposed within third spacing region 226. Gate electrode 134 may be disposed near a top surface of third spacing region 226 within insulating material 130 proximate to second racetrack pillar 212. Gate oxide 126 may be disposed within third spacing region 224 between body region 106 of second racetrack pillar 212 and gate electrode 134. A first field plate 132 may be disposed within insulating material 130 of third spacing region 224 proximate to second racetrack pillar 212. Gate electrode 134 may be disposed between first field plate 132 and body region 106. In this example, FIG. 1 represents a cross-sectional view which includes portions of second racetrack pillar 212, second spacing region 222, and third spacing region 226 of FIG. 2A. However, it is appreciated that FIG. 1 may similarly represent a cross-sectional view of each of the racetrack pillars (210, 212, 214, 216) in the plurality of racetrack pillars 208 and the corresponding adjacent spacing regions (220, 222, 224, 226, 228) in the plurality of spacing regions 218. Furthermore, it is appreciated that while an individual cross-section is illustrated, the structure of semiconductor device 200 may extend across the semiconductor die, with the illustrated cross-section structure being repeated in a direction perpendicular to length of dummy pillar 204.

Figure 2B:
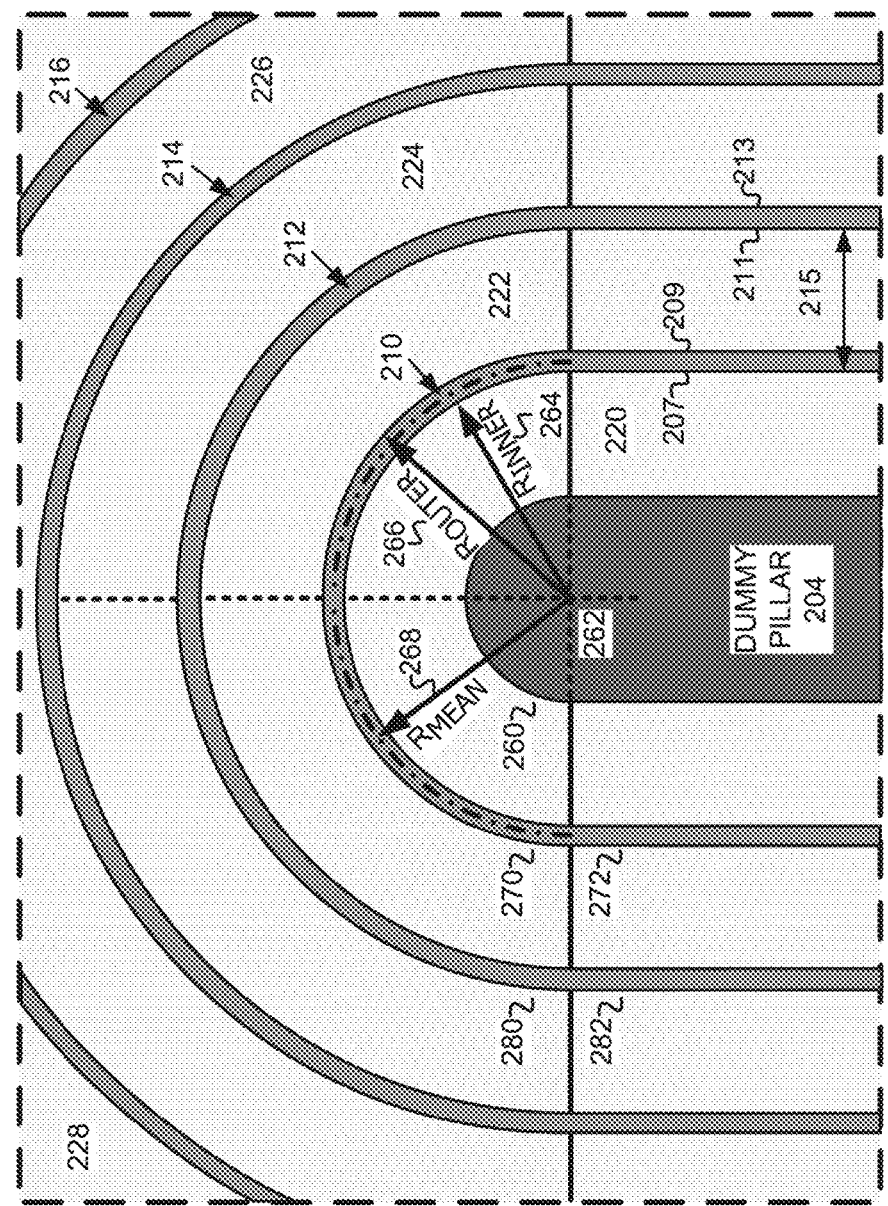
FIG. 2B illustrates a magnified sub-portion of the example semiconductor device of FIG. 2A, in accordance with the teachings of the present invention.

FIG. 2B illustrates a magnified sub-portion 250 of the example semiconductor device 200 illustrated in FIG. 2A, in accordance with the teachings of the present invention. Magnified sub-portion 250 includes dummy pillar 204, first racetrack pillar 210, second racetrack pillar 212, third racetrack pillar 214, fourth racetrack pillar 216, first spacing region 220, second spacing region 222, third spacing region 224, fourth spacing region 226, and fifth spacing region 228. First racetrack pillar 210 includes first inner edge 207, first outer edge 209, first rounded section 270, and first linear section 272. Second racetrack pillar 212 includes second inner edge 211, second outer edge 213, first rounded section 280, and first linear section 282.

Dummy pillar 204 may help avoid flexing of semiconductor device 200 by providing a lateral strength. Dummy pillar 204 may have a minimum width, governed by physical design considerations. The plurality of racetrack pillars 208 may help minimize the area of dummy pillar 204. In another example, dummy pillar 204 may have a different composition or material than the plurality of racetrack pillars 208. The material utilized for dummy pillar 204 should have a thermal coefficient of expansion close to that of silicon, or be sufficiently different from that of the insulating material disposed within the plurality of spacing regions 218 so as to relieve the length-wise stress induced by the insulting material flanking the plurality of racetrack pillars 208.

As illustrated, each of the plurality of racetrack pillars 208 has a first linear section, which extends in the first lateral direction, and a first rounded section to form a racetrack shape. For example, first racetrack pillar 210 includes first linear section 272 and first rounded section 270. Similarly, second racetrack pillar 212 includes first linear section 282 and first rounded section 282. First linear section 272 and first linear section 282 extend in the first lateral direction. For the sake of brevity, a first linear section and first rounded section of each racetrack pillar in the plurality of racetrack pillars 208 is discussed. However, it is appreciated that the racetrack shape of each racetrack pillar, as illustrated in FIG. 2A, forms a closed loop and thus each racetrack pillar (210, 212, 214, and 216) may include other segments such as a second linear section and a second rounded section.

Referring back to FIG. 2B, the first rounded section of each of the plurality of racetrack pillars 208 has a radius of curvature. The radius of curvature of a first rounded section of a racetrack pillar is the radius of a circle tangential to the first rounded section of that racetrack pillar. For example, a width of first racetrack pillar 210 forms first inner edge 207 and first outer edge 209. Inner radius of curvature ($R_{INNER}$) 264 is based on a circle tangential to first inner edge 207 of first rounded section 270. Likewise, outer radius of curvature ($R_{OUTER}$) 266 is based on a circle tangential to first outer edge 209 of first rounded section 270. The average of $R_{OUTER}$ 266 and $R_{INNER}$ 264 is the mean radius of curvature ($R_{MEAN}$) 268. From a geometric perspective, $R_{MEAN}$ 268 corresponds to the radius of curvature of a circle tangential to the mid-point of the width of the first rounded section 270 of first racetrack pillar 210.

In one example, dummy pillar 204 may also have a first rounded section 260. First rounded section 260 may form a semicircle and have a radius of curvature defined by a circle tangential to first rounded section 260 having a center 262. In one example, first rounded sections of the plurality of racetrack pillars (including first racetrack pillar 210, second racetrack pillar 212, third racetrack pillar 214, and fourth racetrack pillar 216) have radii of curvature defined by tangential circles sharing center 262.

A distance 215 between first inner edge 207 of first racetrack pillar 210 and second inner edge 211 of second racetrack pillar 212 may correspond to a pitch of plurality of racetrack pillars 208. For example, the pitch of first racetrack pillar 210 may be approximately 21 micrometers. In one example, first rounded section 270 of first racetrack pillar 210 has a minimum radius of curvature equal to three times the pitch divided by two. The minimum radius of curvature may be a minimum $R_{MEAN}$ 268 of first rounded section 270 in first racetrack pillar 210 rather than an absolute minimum of first rounded section 270. In one example, first racetrack pillar 210 is electrically coupled to second racetrack pillar 212 such that a breakdown voltage of semiconductor device 200 is determined by a minimum radius of first racetrack pillar 210. In other examples, the plurality of racetrack pillars 208 may be electrically coupled in parallel to increase the total current carrying capacity of semiconductor device 200. In one example, the radius of curvature of first racetrack pillar 210 is approximately 7 micrometers and semiconductor device 200 has a breakdown voltage of approximately 550 V. In another example, each of the rounded sections of the plurality of racetrack pillars 208 has an equivalent radius of curvature. Having substantially the same radius of curvature in a racetrack pillar may help distribute the breakdown avalanche current more evenly, providing a better reliability of semiconductor device 200.

Figure 3:
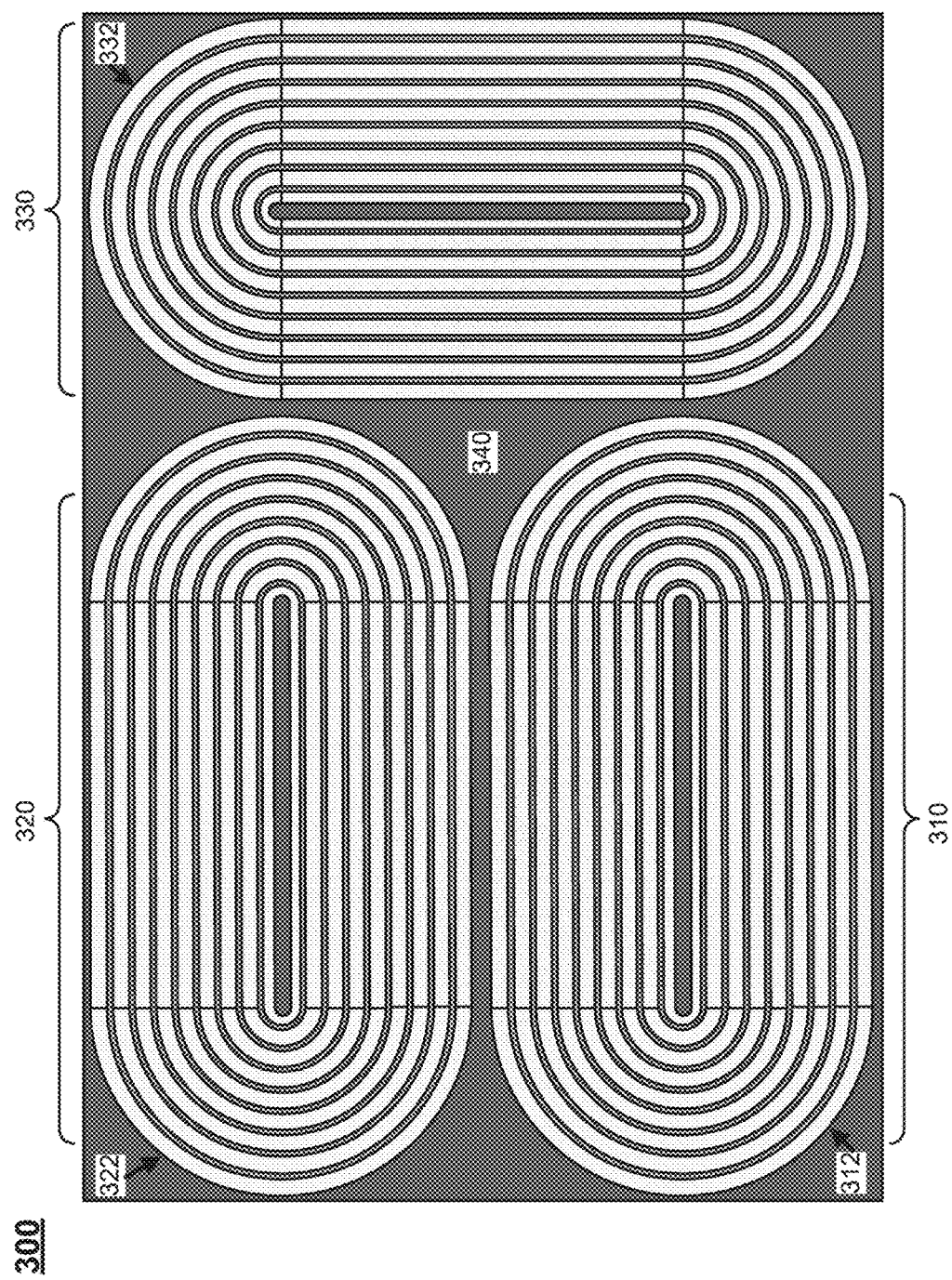
FIG. 3 illustrates an overhead view of an example semiconductor device, in accordance with the teachings of the present invention.

FIG. 3 illustrates an overhead view of an example high voltage semiconductor device system 300, in accordance with the teachings of the present invention. High voltage system 300 includes a plurality of stadium structures (including first stadium structure 310, second stadium structure 320, and third stadium structure 330). Each of the plurality of stadium structures (310, 320, and 330) includes the same or similar features as semiconductor device 200 discussed above.

In the illustrated example, first stadium structure 310 is parallel to second stadium structure 320. First stadium structure 310 and second stadium structure 320 may also be perpendicular to third stadium structure 330. An interface pillar 340 of the semiconductor material is disposed between first stadium structure 310, second stadium structure 320, and third stadium structure 330. Interface pillar 340 may introduce stress-relief in the elongated racetrack shaped transistor segments. Segmenting or breaking the semiconductor device system 300 into two or more sections relieves mechanical stress across the length of the die. This stress is induced by the insulating material flanking the plurality of racetrack pillars and normally concentrates at the rounded sections of each of the plurality of racetrack pillars. Relieving mechanical stress by segmenting the semiconductor device system 300 into two or more sections thus prevents undesirable warping of the plurality of racetrack pillars and damage (e.g., dislocations) to the silicon caused by stress. In another example, interface pillar 340 may have a different composition or material than the plurality of racetrack pillars and/or the respective dummy pillars. The material utilized for the interface pillar 340 should have a thermal coefficient of expansion close to that of silicon, or be sufficiently different from that of the insulating material so as to relieve the length-wise stress induced by the insulting material flanking the plurality of racetrack pillars.

In one example, a first area of first stadium structure 310 may be determined by boundary edge 312. A second area of second stadium structure 320 may be determined by boundary edge 322. A third area of stadium structure 330 may be determined by boundary edge 332. The first area of first stadium structure 310 may be substantially equal to the second area of second stadium structure 320 and the third area of third stadium structure 330 may be substantially equal to the first area and the second area.

In another example, each of the plurality of stadium structures (310, 320, and 330) form separate semiconductor devices. The separate semiconductor devices may include at least one of a transistor or a diode, including for example, an IGBT. In one example, at least one of the plurality of stadium structures in high voltage semiconductor device system 300 has a mean radius of curvature of approximately 21 micrometers and has a breakdown voltage of 640 V.

Figure 4A:
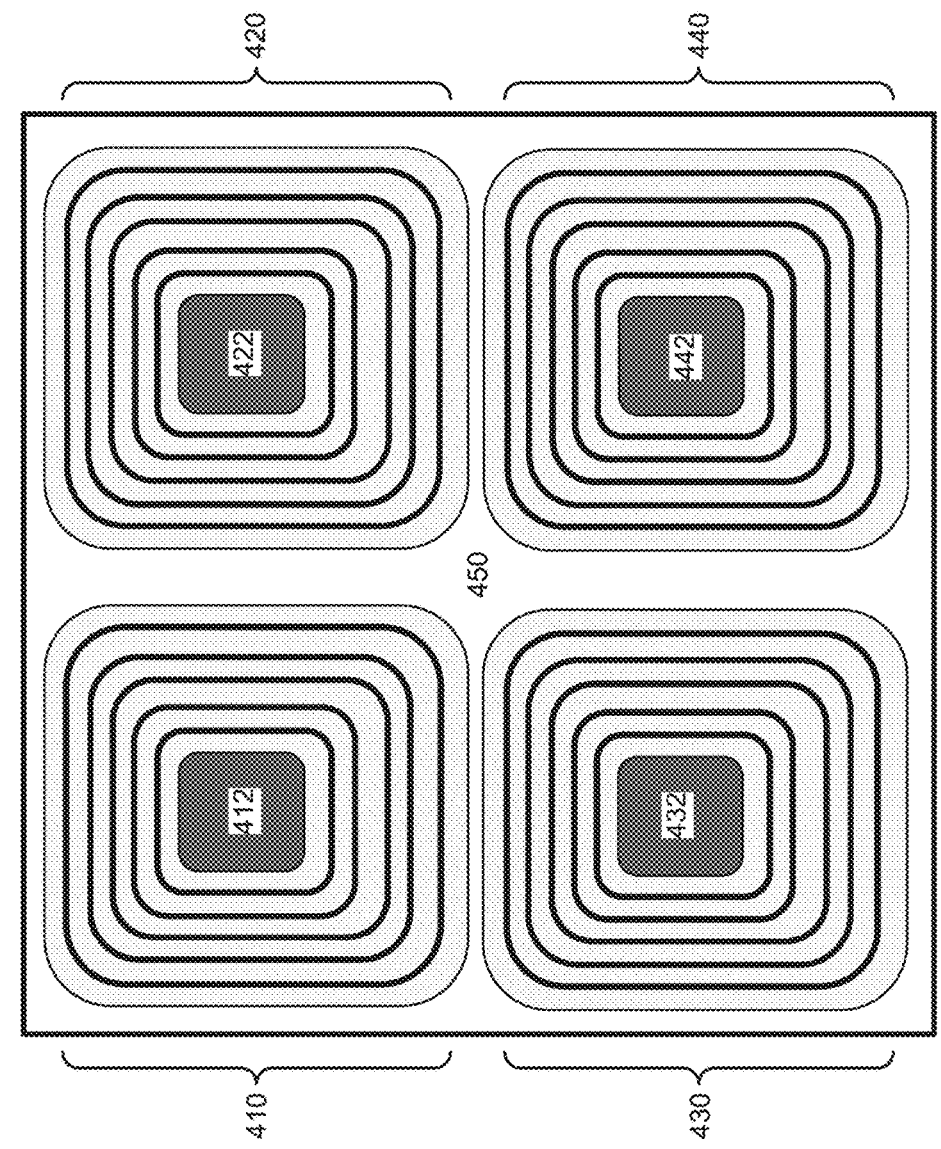
FIG. 4A illustrates an overhead view of an example semiconductor device, in accordance with the teachings of the present invention.

FIG. 4A illustrates an overhead view of an example system 400, in accordance with the teachings of the present invention. System 400 includes a plurality of stadium structures (including first stadium structure 410, second stadium structure 420, third stadium structure 430, and fourth stadium structure 440). Each of the plurality of stadium structures includes a respective dummy pillar of the semiconductor material. For example, first stadium structure 410 includes dummy pillar 412, second stadium structure 420 includes dummy pillar 422, third stadium structure 430 includes dummy pillar 432, and fourth stadium structure 440 includes dummy pillar 442. Plurality of stadium structures (410, 420, 430, and 440) may be arranged in a two-by-two square matrix such that an interface pillar 450 of the semiconductor material is disposed between each of the plurality of stadium structures (410, 420, 430, and 440).

System 400 is similar to previously illustrated system 300 of FIG. 3. For example, each stadium structure in the plurality of stadium structures of system 300 and system 400 has a racetrack shape with four-fold rotational symmetry. Each of the plurality of stadium structures of system 400 may include the same or similar features as semiconductor device 200. One difference of system 400 to previously discussed semiconductor devices is the arrangement and shape of the plurality of racetrack pillars. For example, the racetrack shape of system 400 forms a shape similar to a square, while the racetrack shape of semiconductor device 200 forms a shape similar to a rectangle. Furthermore, it is appreciated that the racetrack shape is not limited to a rectangular or square shape. For example a racetrack shape having a substantially hexagonal shape may be utilized. A hexagonal shape racetrack pillar may also have six-fold rotational symmetry.

In the illustrated example, each of the plurality of racetrack pillars in each of the stadium structures (410, 420, 430, 440) includes a first linear section, a second linear section, a third linear section, and a fourth linear section. The first linear section and the second linear section extend in the first lateral direction, while the third linear section and the fourth linear section extend in a second lateral direction. The first lateral direction being perpendicular to the second lateral direction. As illustrated, each of the plurality of racetrack pillars further includes a first rounded section, a second rounded section, a third rounded section, and a fourth rounded section.

Figure 4B:
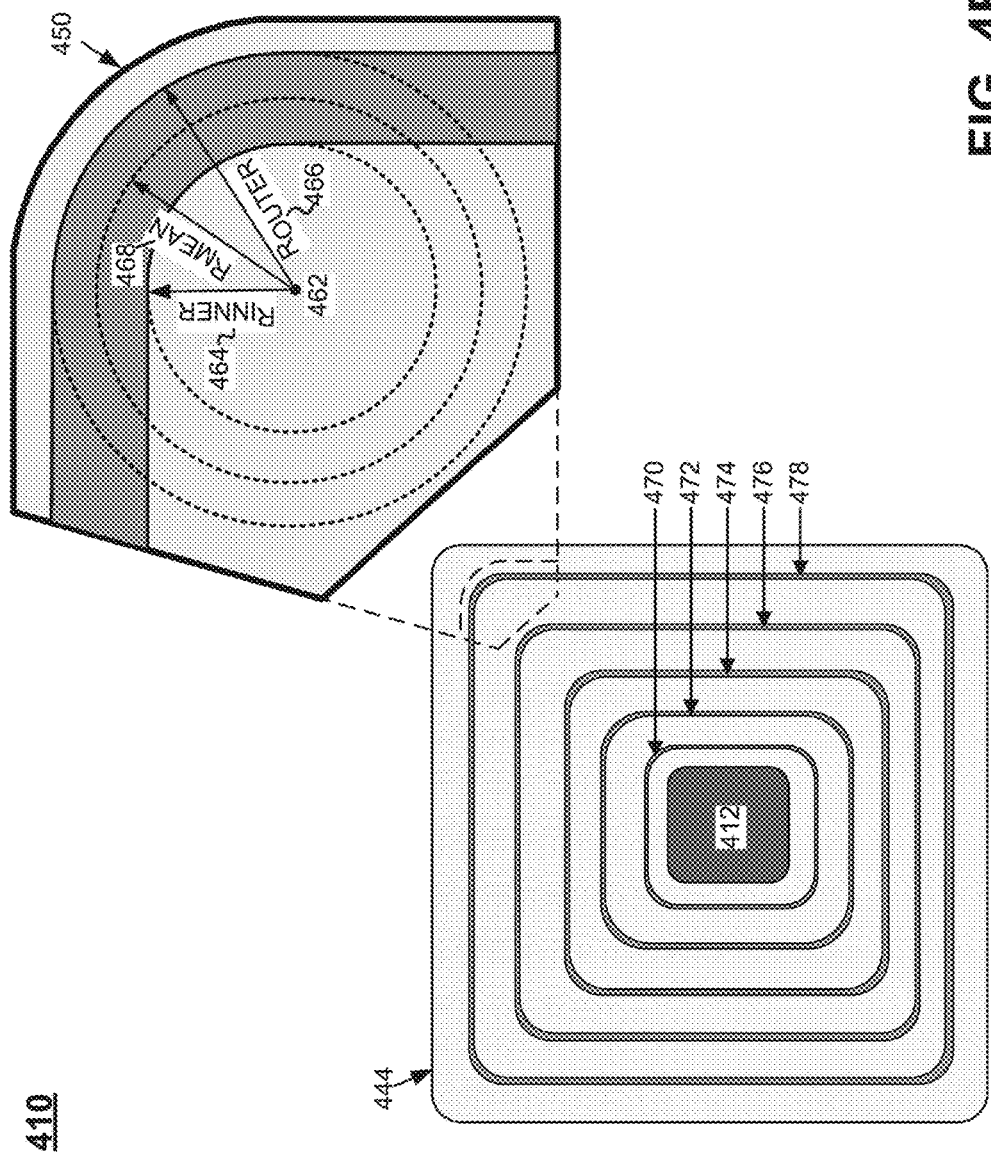
FIG. 4B illustrates a magnified sub-portion of the example semiconductor device of FIG. 4A, in accordance with the teachings of the present invention.

FIG. 4B illustrates first stadium structure 410 and a magnified sub-portion 450 of first stadium structure 410 of the example semiconductor device of FIG. 4A, in accordance with the teachings of the present invention. First stadium structure 410 includes dummy pillar 412 and a plurality of racetrack pillars (470, 472, 474, 476, and 478). In one example, the first rounded section, the second rounded section, the third rounded section, and the fourth rounded section of first racetrack pillar 470 have equivalent respective radii of curvature. Segment 450 of first stadium structure 410 illustrates a structure similar to previously described semiconductor device 200. For example, a rounded section of fifth racetrack pillar 478 has an inner radius of curvature ($R_{INNER}$) 464, an outer radius of curvature ($R_{OUTER}$) 466, and a mean radius of curvature ($R_{MEAN}$) 468 which all form tangential circles sharing a common center 462. An area of first stadium structure 410 may be defined by boundary edge 444. Stadium structures (including second stadium structure 420, third stadium structure 430, and fourth stadium structure 440) may also have an area defined by a boundary edge. The area of first stadium structure 410, second stadium structure 420, third stadium structure 430, and fourth stadium structure 440 may be the same or substantially similar.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A semiconductor device comprising:
   a dummy pillar of semiconductor material that extends in a first lateral direction;
   a plurality of racetrack pillars including the semiconductor material surrounding the dummy pillar, wherein each of the plurality of racetrack pillars has a first linear section, that extends in the first lateral direction, and a first rounded section to form a racetrack shape, and wherein the plurality of racetrack pillars includes:
      a first racetrack pillar disposed proximate to the dummy pillar; and
      a second racetrack pillar surrounding the first racetrack pillar, wherein the first racetrack pillar is disposed between the dummy pillar and the second racetrack pillar; and
   a plurality of spacing regions including a first spacing region and a second spacing region, wherein the first spacing region surrounds the dummy pillar and is disposed between the first racetrack pillar and the dummy pillar, and wherein the second spacing region surrounds the first racetrack pillar and is disposed between the first racetrack pillar and the second racetrack pillar.

2. The semiconductor device of claim 1, wherein a distance between a first inner edge of the first racetrack pillar and a second inner edge of the second racetrack pillar corresponds to a pitch of the plurality of racetrack pillars, and wherein the first rounded section of the first racetrack pillar has a minimum radius of curvature equal to three times the pitch divided by two.

3. The semiconductor device of claim 2, wherein the minimum radius of curvature of the first racetrack pillar is twenty one micrometers.

4. The semiconductor device of claim 1, wherein a first distance between the dummy pillar and the first racetrack pillar is constant, and wherein the first distance is equal to a first width of the first spacing region.

5. The semiconductor device of claim 4, wherein a second distance between the first racetrack pillar and the second racetrack pillar is constant, and wherein the second distance is equal to a second width of the second spacing region, and wherein the first width is different than the second width.

6. The semiconductor device of claim 1, wherein the plurality of spacing regions includes a third spacing region that surrounds the second racetrack pillar, and wherein the second racetrack pillar is disposed between the second spacing region and the third spacing region.

7. The semiconductor device of claim 6, wherein the first spacing region, the second spacing region, and the third spacing region include dielectric material, wherein the first spacing region and the second spacing region are disposed to electrically isolate the first racetrack pillar, and wherein the second spacing region and the third spacing region are disposed to electrically isolate the second racetrack pillar.

8. The semiconductor device of claim 7, wherein the semiconductor device is a high-voltage vertical transistor and includes:
   a source region of a first conductivity type disposed within the second racetrack pillar proximate to a first surface of the second racetrack pillar;
   a body region of a second conductivity type disposed within the second racetrack pillar;
   a drain region of the first conductivity type disposed within the second racetrack pillar, wherein the body region is disposed between the source region and the drain region; and
   a gate electrode disposed within the third spacing region, wherein the gate electrode is disposed within the dielectric material proximate to the second racetrack pillar, and wherein a gate oxide is disposed between the gate electrode and the body region.

9. The semiconductor device of claim 8, wherein the first racetrack pillar is electrically coupled to the second racetrack pillar such that a breakdown voltage of the semiconductor device is determined by a minimum radius of curvature of the first racetrack pillar.

10. The semiconductor device of claim 8, further comprising a plurality of field plates surrounded by the dielectric material, the plurality of field plates including a first field plate disposed within the third spacing region, wherein the first field plate is disposed within the dielectric material proximate to the second racetrack pillar, and wherein the gate electrode is disposed between the first field plate and the body region.

11. The semiconductor device of claim 1, wherein the racetrack shape has four-fold rotational symmetry.

12. The semiconductor device of claim 10, wherein each of the plurality of racetrack pillars further includes a second linear section, a third linear section, and a fourth linear section, wherein the first linear section and the second linear section extend in the first lateral direction, and wherein the third linear section and the fourth linear section extend in a second lateral direction, and wherein the first lateral direction is perpendicular to the second lateral direction.

13. The semiconductor device of claim 11, wherein each of the plurality of racetrack pillars further includes a second rounded section, a third rounded section, and a fourth rounded section, and wherein the first rounded section, the second rounded section, the third rounded section, and the fourth rounded section of the first racetrack pillar have equivalent respective radii of curvature.

14. The semiconductor device of claim 1, wherein the plurality of racetrack pillars includes a third racetrack pillar and a fourth racetrack pillar, wherein the third racetrack pillar is disposed between the second racetrack pillar and the fourth racetrack pillar, and wherein a fourth spacing region included in the plurality of spacing regions surrounds the third racetrack pillar, and wherein the fourth spacing region is disposed between the third racetrack pillar and the fourth racetrack pillar.

15. A high voltage system comprising:
a plurality of stadium structures, wherein each stadium structure in the plurality of stadium structures includes:
a dummy pillar of semiconductor material that extends in a first lateral direction;
a plurality of racetrack pillars including the semiconductor material surrounding the dummy pillar, wherein each of the plurality of racetrack pillars has a first linear section, that extends in the first lateral direction, and a first rounded section to form a racetrack shape, and wherein the plurality of racetrack pillars includes:
a first racetrack pillar disposed proximate to the dummy pillar; and
a second racetrack pillar surrounding the first racetrack pillar, wherein the first racetrack pillar is disposed between the dummy pillar and the second racetrack pillar; and
a plurality of spacing regions including a first spacing region and a second spacing region, wherein the first spacing region surrounds the dummy pillar and is disposed between the first racetrack pillar and the dummy pillar, and wherein the second spacing region surrounds the first racetrack pillar and is disposed between the first racetrack pillar and the second racetrack pillar.

16. The high voltage system of claim 15, wherein the plurality of stadium structures includes a first stadium structure, a second stadium structure, and a third stadium structure, wherein the first stadium structure is parallel to the second stadium structure, and wherein the third stadium structure is perpendicular to the first stadium structure.

17. The high voltage system of claim 15, wherein the plurality of stadium structures includes a first stadium structure, a second stadium structure, and a third stadium structure, and wherein an interface pillar of the semiconductor material is disposed between the first stadium structure, the second stadium structure, and the third stadium structure.

18. The high voltage system of claim 15, wherein the plurality of stadium structures includes a first stadium structure, a second stadium structure, and a third stadium structure, wherein a first area of the first stadium structure is substantially equal to a second area of the second stadium structure, and wherein a third area of the third stadium structure is substantially equal to the first area and the second area.

19. The high voltage system of claim 15, wherein each of the plurality of stadium structures forms separate semiconductor devices, and wherein the separate semiconductor devices include at least one of a transistor or a diode.

20. The high voltage system of claim 15, wherein the plurality of stadium structures includes a first stadium structure, and wherein a distance between a first inner edge of the first racetrack pillar in the first stadium structure and a second inner edge of the second racetrack pillar in the first stadium structure corresponds to a pitch of the plurality of racetrack pillars of the first stadium structure, and wherein the first rounded section of the first racetrack pillar in the first stadium structure has a minimum radius of curvature equal to three times the pitch divided by two.

21. The high voltage system of claim 15, wherein each of the plurality of racetrack pillars included in each of the plurality of stadium structures includes:
a source region of a first conductivity type disposed within each of the plurality of racetrack pillars;
a body region of a second conductivity type disposed within each of the plurality of racetrack pillars;
a drain region of the first conductivity type disposed within each of the plurality of racetrack pillars, wherein the body region is disposed between the source region and the drain region; and
a gate electrode surrounded by a dielectric material disposed within each of the plurality of spacing regions.

* * * * *